(12) United States Patent
Shimoe et al.

(10) Patent No.: US 7,034,515 B2
(45) Date of Patent: Apr. 25, 2006

(54) INSTANTANEOUS VOLTAGE LOWERING DETECTION DEVICE

(75) Inventors: Yasufumi Shimoe, Tokyo (JP); Yoshihiro Hatakeyama, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/516,690

(22) PCT Filed: Dec. 19, 2003

(86) PCT No.: PCT/JP03/16315

§ 371 (c)(1),
(2), (4) Date: Dec. 6, 2004

(87) PCT Pub. No.: WO2004/109303

PCT Pub. Date: Dec. 16, 2004

(65) Prior Publication Data

US 2006/0012379 A1 Jan. 19, 2006

(30) Foreign Application Priority Data

Jun. 5, 2003 (JP) .............................. 2003-161120

(51) Int. Cl.
*G01D 1/14* (2006.01)
*G01R 23/12* (2006.01)
*G01R 29/02* (2006.01)

(52) U.S. Cl. .............................. 324/76.13; 324/76.53; 327/37

(58) Field of Classification Search ................ 324/622, 324/76.13, 76.12, 76.52, 76.53; 327/37
See application file for complete search history.

(56) References Cited

U.S. PATENT DOCUMENTS

| 3,648,070 | A | * | 3/1972 | Eicher | 327/72 |
| 5,512,837 | A | * | 4/1996 | Ohnishi | 324/704 |
| 6,628,125 | B1 | * | 9/2003 | Fazakas | 324/678 |
| 6,850,237 | B1 | * | 2/2005 | Nakayama | 345/440 |

FOREIGN PATENT DOCUMENTS

| JP | 2000-55947 A | 2/2000 |
| JP | 2002-171690 A | 6/2002 |

* cited by examiner

*Primary Examiner*—Anjan Deb
*Assistant Examiner*—Jeff Natalini
(74) *Attorney, Agent, or Firm*—Sughrue Mion, PLLC

(57) ABSTRACT

An instantaneous voltage dip detection device is provided with: all-pass filter (2) for phase shifting a supply voltage waveform (11) by 90°; a comparator 7 that outputs a signal when the supply voltage waveform (11) is smaller than a threshold (12) in regions of $\pi/4$ to $3\pi/4$, $5\pi/4$ to $7\pi/4$; a comparator (8) that outputs a signal when a phase shift voltage waveform (13) is smaller than a threshold (14) in regions of 0 to $\pi/4$, $3\pi/4$ to $5\pi/4$, $7\pi/4$ to $2\pi$; an OR circuit (9) to which signals from the comparators (7), (8) are inputted; and a signal generator (10) for generating a voltage dip detection signal in response to an output from the OR circuit (9).

19 Claims, 11 Drawing Sheets

INSTANTANEOUS VOLTAGE LOWERING DETECTION DEVICE

TECHNICAL FIELD

This invention relates to an instantaneous voltage dip detection device for detecting an instantaneous voltage dip in distribution network that occurs due to lightning or the like.

BACKGROUND ART

As has been disclosed, for example, in the Japanese Patent Publication (unexamined) 2000-55947 and the Japanese Patent Publication (unexamined) 2002-171690 respectively, according to the publicly known instantaneous voltage dip detection devices, results of subtraction between an absolute value waveform of a reference sine wave and a reference cosine wave each synchronizing with a supply voltage and an absolute value waveform of a supply sine wave and a supply cosine wave are respectively obtained; the obtained results of subtraction are then integrated; and in the case where any of the results of integration exceeds a reference value, it is determined that a voltage dip has occurred.

In the aforementioned conventional system, however, since the integration is utilized for the detection of voltage dip, a problem exists in that it takes a time of about ¼ cycle of an AC waveform in the detection and determination. Moreover, another problem exists in that if arranging an instantaneous voltage dip compensating device using such an instantaneous voltage dip detection device, service interruption over ¼ cycle takes place from the start of voltage dip up to the switching to the voltage dip compensating operation.

DISCLOSURE OF INVENTION

This invention was made to solve the above-discussed problems and has an object of providing a system for detecting a voltage dip at a high speed.

To accomplish the foregoing object, an instantaneous voltage dip detection device according to this invention is characterized by including:
  phase shifting means for shifting a supply voltage waveform by a predetermined angle and generating a phase shift voltage waveform;
  phase lock means for detecting the zero voltage phase of the supply voltage waveform;
  supply voltage waveform threshold generating means for generating a supply voltage waveform threshold acting as a voltage dip determination reference with respect to the mentioned supply voltage waveform in synchronization with the mentioned phase lock means;
  phase shift voltage waveform threshold generating means for generating a phase shift voltage waveform threshold acting as a voltage dip determination reference with respect to the mentioned phase shift voltage waveform;
  determination region setting means for setting a part or all of absolute values of the mentioned supply voltage waveform threshold and phase shift voltage waveform threshold that are larger than a predetermined value as being a comparative determination effective region;
  supply voltage waveform comparing means for outputting a voltage dip detection signal based on the comparison between the mentioned supply voltage waveform and the supply voltage waveform threshold, in the case where the mentioned determination region setting means determines as being a comparative determination effective region of the supply voltage waveform; and
  phase shift voltage waveform comparing means for outputting a voltage dip detection signal based on the comparison between the mentioned phase shift voltage waveform and the phase shift voltage waveform threshold, in the case where the mentioned determination region setting means determines as being a comparative determination effective region of the phase shift voltage waveform.

Another instantaneous voltage dip detection device according to this invention is characterized by including:
  phase lock means for detecting the zero voltage phase of the supply voltage waveform;
  supply voltage waveform threshold generating means for generating a supply voltage waveform threshold acting as a voltage dip determination reference with respect to the mentioned supply voltage waveform in synchronization with the mentioned phase lock means;
  waveform recording means for recording sequentially supply voltage waveforms in synchronization with the phase lock means;
  recorded waveform threshold generating means for generating a lower limit threshold or an upper limit threshold by a predetermined calculation based on the mentioned recorded waveforms;
  determination region setting means for setting a comparative determination effective region in synchronization with the phase lock means;
  supply voltage waveform comparing means for outputting a voltage dip detection signal based on the comparison between the mentioned supply voltage waveform and the supply voltage waveform threshold, in the case where the mentioned determination region setting mean-s determines as being a comparative determination effective region of the supply voltage waveform;
  recorded waveform comparing means for outputting a voltage dip detection signal based on the comparison between the mentioned supply voltage waveform and the recorded waveform threshold, in the case where the mentioned determination region setting means determines as being a comparative determination effective region of the recorded waveform;
  continuity determination means for determining that the mentioned supply voltage waveform comparing means outputs the voltage dip detection signal continuously for a predetermined time period;
  logical multiplication (AND) means between the output of the supply voltage waveform comparing means and the output of the recorded waveform comparing means; and
  voltage dip detection output means for outputting a voltage dip detection signal by logical addition (OR) means between the output of the mentioned logical multiplication (AND) means and the output of the continuity determination means.

According to this invention, since the detection device not using any integration but using an instantaneous comparison is used for detection of a voltage dip, it is possible to detect voltage dip at a high speed. Further, since the detection device not using any integration taking a long time (over ¼ cycle) is used for the detection of voltage dip, it is possible to detect voltage dip at a high speed. Switching a phase to be detected makes it possible to carry out a determination processing with a high level signal at all times, enabling to perform a stable detection. Further, carrying out an operation for a short time in a low-level signal region (near zero voltage phase) makes it possible to perform a stable detection. Furthermore, even in the state of superimposed harmonics, a stable detection can be performed by relieving the threshold conforming to a level of the harmonics and carrying out a comparative determination in comparison with the recorded waveforms.

BEST MODE FOR CARRYING OUT THE INVENTION

Embodiment 1

Figure 1:
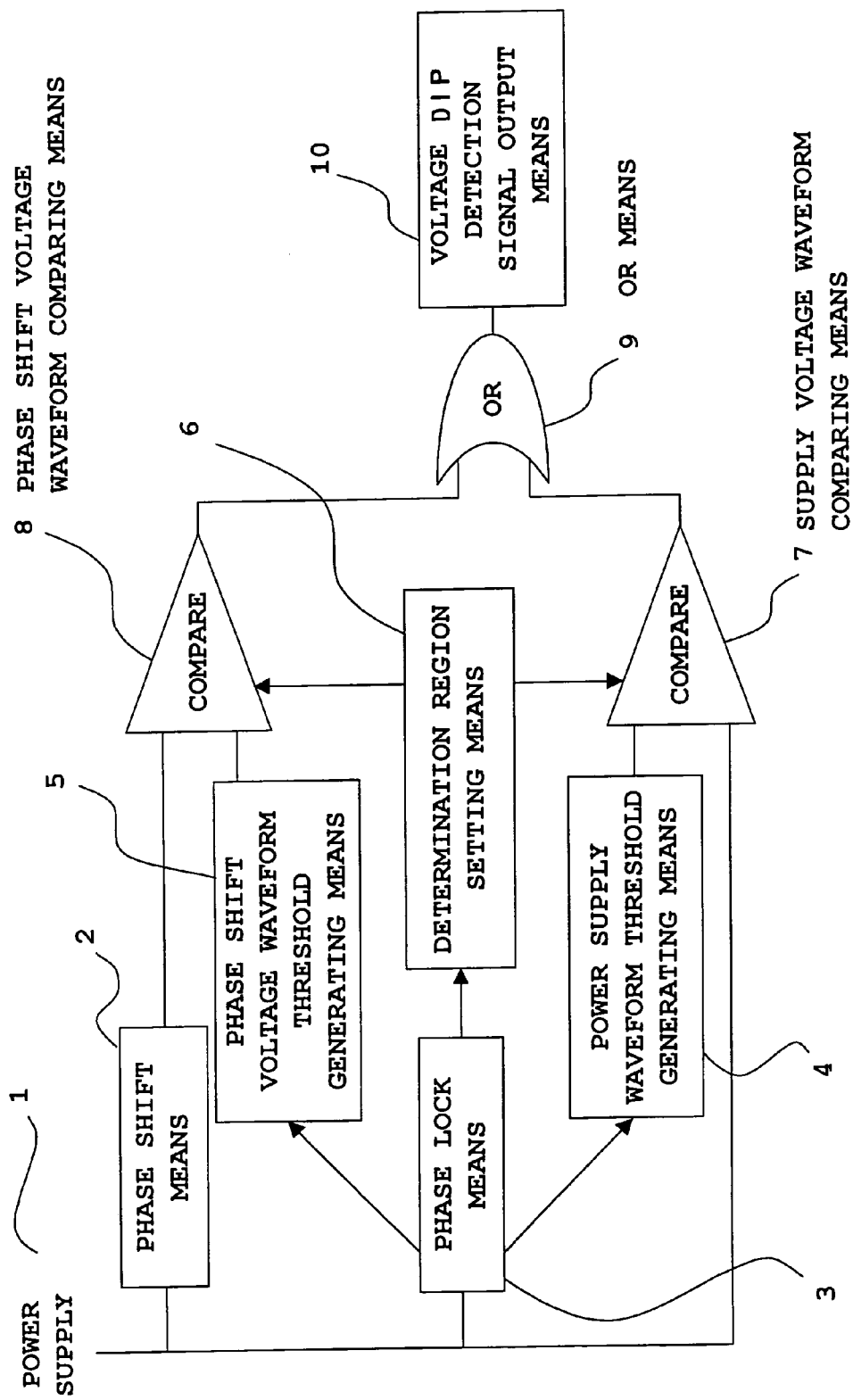
FIG. 1 is a block diagram showing an instantaneous voltage dip detection device according to Embodiment 1 of the present invention.
Figure 2:
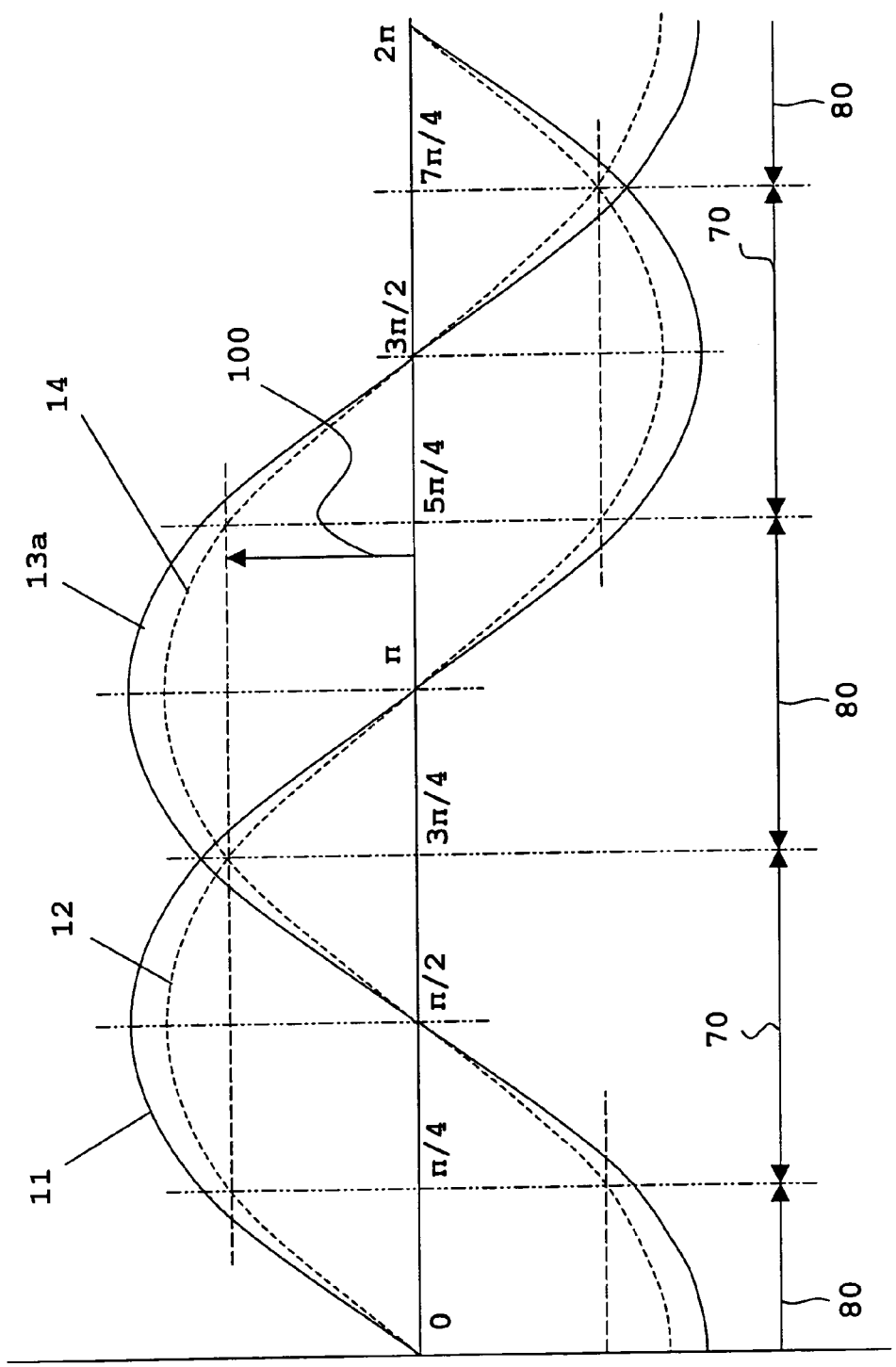
FIG. 2 is a waveform chart showing each of signal waveforms at the normal time of the instantaneous voltage dip detection device in FIG. 1.
Figure 3:
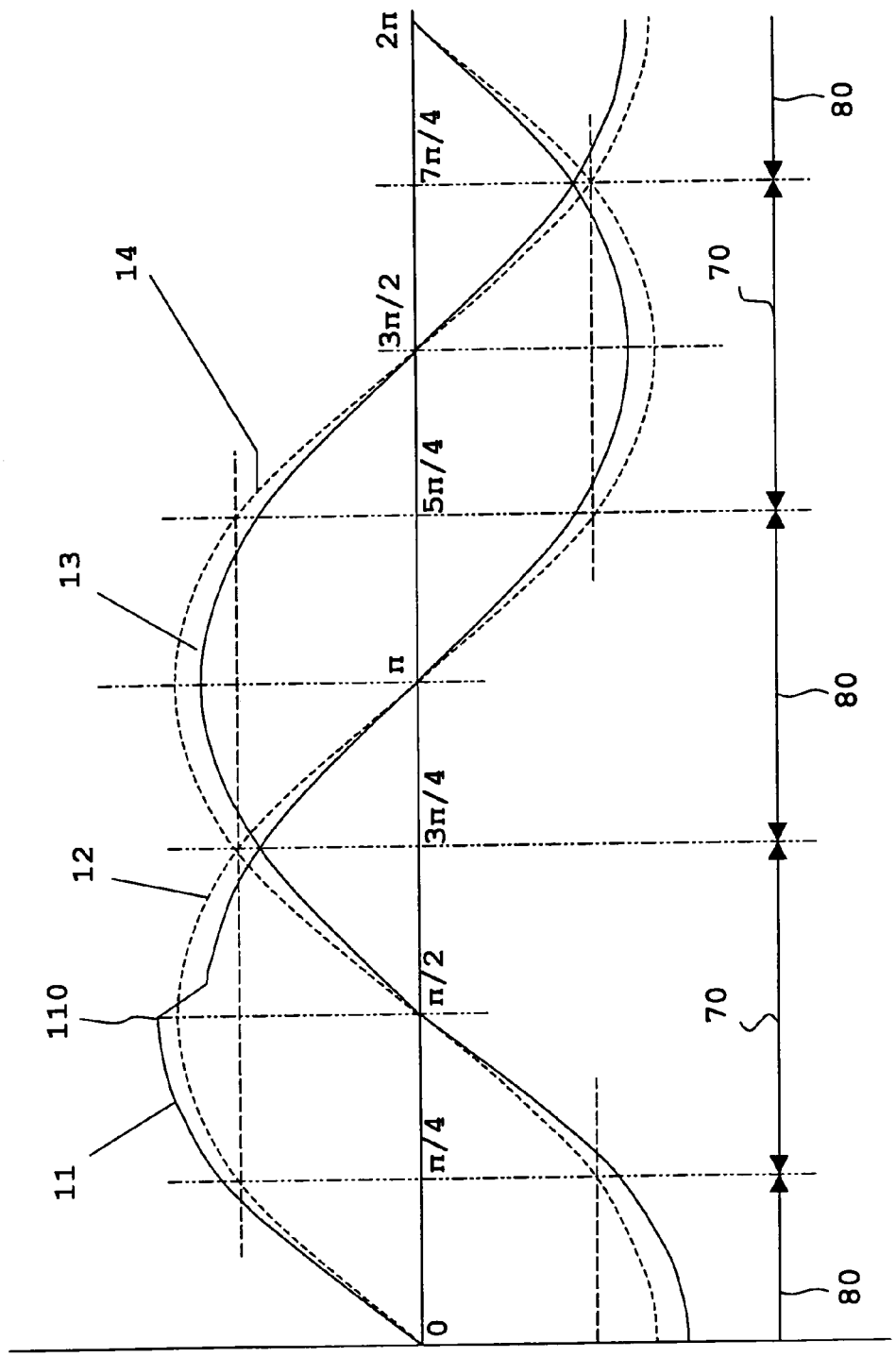
FIG. 3 is a signal waveform diagram showing each of signal waveforms at the time of occurrence of a voltage dip in the instantaneous voltage dip detection device in FIG. 1.

FIG. 1 is a block diagram showing an instantaneous voltage dip detection device according to Embodiment 1 of the present invention, FIG. 2 is a waveform chart showing each of signal waveforms at the normal time of the instantaneous voltage dip detection device in FIG. 1, and FIG. 3 is a signal waveform diagram showing each of signal waveforms at the time of occurrence of a voltage dip in the instantaneous voltage dip detection device in FIG. 1.

Now Embodiment 1 is hereinafter described with reference to FIGS. 1 to 3. The instantaneous voltage dip detection device shown in FIG. 1 includes: phase shift means 2 for shifting a phase of a supply voltage waveform 11 (see FIG. 2) being a signal waveform of a power supply 1 by a predetermined angle (for example 20° to 160°, more preferably 90°); and phase lock means 3 for detecting zero voltage phase (zero-cross point) of the supply voltage waveform. In synchronization with this phase lock means 3, power supply waveform threshold generating means 4 generates a power supply waveform threshold 12 (see FIG. 2) serving as a voltage dip criterion with respect to the supply voltage waveform 11. On the other hand, phase shift voltage waveform threshold generating means 5 generates a phase shift voltage waveform threshold 14 (see FIG. 2) serving as a voltage dip determination criterion with respect to a phase shift voltage waveform 13 (see FIG. 2) shifted by about 90° from the zero voltage phase of the supply voltage waveform 11 detected by the phase lock means 3. In the mentioned process, the power supply waveform threshold generating means 4 and the phase shift voltage waveform threshold generating means 5 prepare the threshold 12 and the threshold 14 by multiplying data of table form, in which phase and amplitude value of a sine wave (trigonometric function preliminarily stored in a memory are paired, by a set value set by user or manufacturer, and output them.

For example, in a manufacturing apparatus driven at a supply voltage of which effective value is 200V, when an input voltage has dipped to not higher than 160V, a set value is 0.8 (=160/200) in order to detect the instantaneous voltage dip. That is, the threshold 12 and the threshold 14 are prepared and outputted so that amplitude is 0 when phase is $0\pi$ (=200×$\sqrt{2}$×sin($0\pi$)×0.8), amplitude is $80\sqrt{2}$ when phase is $\pi/6$ (=200×$\sqrt{2}$×sin($\pi/6$)×0.8), amplitude is 160 when phase is $\pi/4$ (=200×$\sqrt{2}$×sin($\pi/4$)×0.8), and amplitude is $160\sqrt{2}$ when phase is $\pi/2$ (=200×$\sqrt{2}$×sin($\pi/2$)×0.8).

Determination region setting means 6 is provided to set, in synchronization with the phase lock means, a part of the supply voltage waveform threshold 12 and phase shift voltage waveform threshold 14 that are larger than a predetermined value, e.g., apart in which amplitude of each threshold is larger than about 70% of a peak value line 100 (sin($n\pi/4$)=0.707 . . . , n=1, 3, 5, 7 . . . ), as being a comparative determination effective region. Further, supply voltage waveform comparing means 7 and phase shift voltage waveform comparing means 8 are provided. The supply voltage waveform comparing means 7 makes a comparison in magnitude between a supply voltage waveform 11 and a supply voltage waveform threshold 12 in the case where the determination region setting means 6 has determined a comparative determination region 70 (for example, $\pi/4$ to $3\pi/4$, $5\pi/4$ to $7\pi/4$ in FIG. 2) of the supply voltage waveform, and then outputs a voltage dip detection signal. The phase shift voltage waveform comparing means 8 makes a comparison in magnitude between a phase shift voltage waveform 13 and a phase shift voltage waveform threshold 14 in the case where the determination region setting means 6 has determined a comparative determination region 80 (for example, 0 to $\pi/4$, $3\pi/4$ to $5\pi/4$, $7\pi/4$ to $2\pi$ in FIG. 2) of the supply voltage waveform, and then outputs a voltage dip detection signal.

Furthermore, there are provided logical addition (OR) means 9 for outputting a logical addition (OR) of output of the supply voltage waveform comparing means 7 and output of the phase shift voltage waveform comparing means 8, and voltage dip signal detection output means 10 for outputting a voltage dip signal in the case where any voltage dip has been detected by the supply voltage waveform comparing means 7 or by the phase shift voltage waveform comparing means 8 upon receiving the output of the logical addition (OR) means 9.

Operations of the instantaneous voltage dip detection device according to Embodiment 1 arranged as described above are hereinafter described with reference to FIGS. 1 to 3. As shown in FIG. 2, in the normal state that there is neither abnormality in supply voltage nor voltage dip, the supply voltage waveform comparing means 7 makes a comparison in magnitude between the supply voltage waveform 11 and supply voltage waveform threshold 12 of the power supply voltage 1 being in synchronization with each other by the phase lock means 3 in a region where the supply voltage waveform threshold 12 determined by the determination region setting means 6 is not smaller than a predetermined value, for example, at the phases of $\pi/4$ to $3\pi/4$ and $5\pi/4$ to $7\pi/4$ (in repeating fashion) of FIG. 2 being a region 70 in which magnitude of the threshold is not smaller than 70% of the peak value.

Further, the phase shift voltage waveform comparing means 8 makes a comparison in magnitude between the phase shift voltage waveform 13 and phase shift voltage waveform threshold 14 being in synchronization with each other in a region where the phase shift voltage waveform threshold 14 determined by the determination region setting means 6 is not smaller than a predetermined value, for example, at the phases of 0 to $\pi/4$, $3\pi/4$ to $5\pi/4$ and $7\pi/4$ to $2\pi$ (in repeating fashion) of FIG. 2 being a region 80 in which magnitude of the threshold is not smaller than 70% of the peak value.

As shown in FIG. 3, in the case where an instantaneous voltage dip occurs at the phase $\pi/2$ in the supply voltage 1, the supply voltage waveform comparing means 7 that compares amplitude in absolute value of the supply voltage waveform 11 and the supply voltage waveform threshold 12 has a smaller supply voltage waveform 11 than the supply voltage waveform threshold 12, and therefore outputs an instantaneous voltage dip signal. When it is determined that such an instantaneous voltage dip has occurred (i.e., as the phase is on the positive side, in the case where the supply voltage waveform 11 is less than the supply voltage waveform threshold 12), a signal is outputted from the logical addition (OR) means 9, and a voltage dip detection signal is outputted from the voltage dip detection signal output means 10.

As described above, since the supply voltage waveform comparing means 7 determines the instantaneous voltage dip continuously at an instantaneous value, any instantaneous voltage dip can be detected at a high speed, for example, at a cycle of not more than 1/10 of one wavelength. Further, since the voltage dip can be determined using only a region where voltage waveform level for detecting the voltage dip is larger, stable and constant detection can be performed. Accordingly, when arranging a voltage compensation apparatus in combination of the instantaneous voltage dip detection device, it becomes possible to compensate an instantaneous voltage dip in a very short time.

Further, since a phase shift voltage waveform shifting a supply voltage waveform by 90° is also utilized in the detection of the instantaneous voltage dip, the instantaneous voltage dip detection device can be used for detecting any region, where voltage waveform level is large, of at least either the supply voltage waveform or the phase shift voltage waveform, and a determination region that is continuous in time can be obtained.

In addition, although an example in which phase shift voltage waveform is one is described above, it is possible that there are two or more phase shift voltage waveforms. For example, in the case of two phase shift voltage waveforms, phase is shifted by every 60°. In this case, however, circuit arrangement will be complicated and therefore one phase shift voltage waveform is preferably.

Embodiment 2

Figure 4:
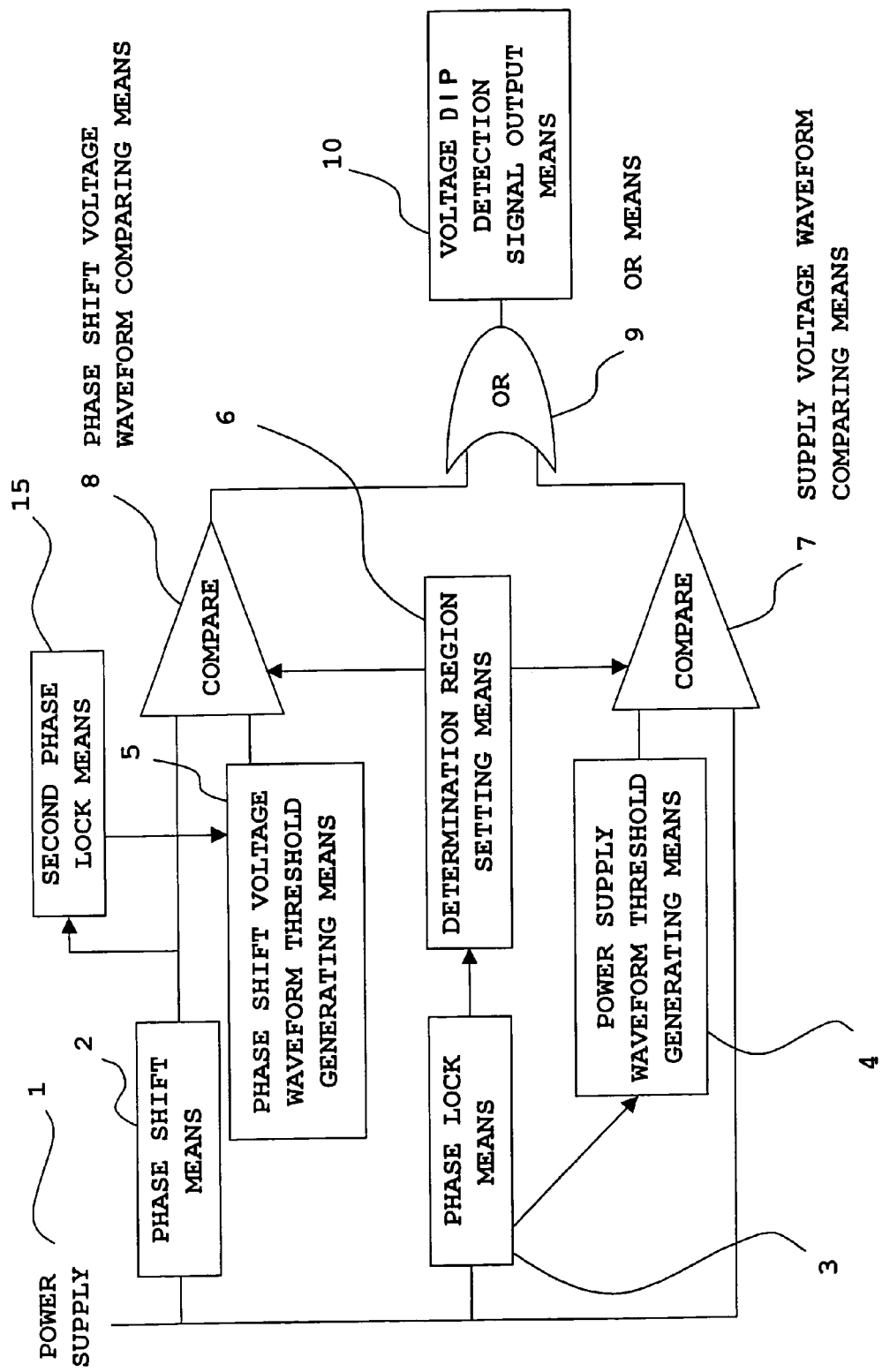
FIG. 4 is a block diagram showing an instantaneous voltage dip detection device according to Embodiment 2 of the invention.

FIG. 4 is a block diagram showing an instantaneous voltage dip detection device according to Embodiment 2 of the invention. In this Embodiment 2, second phase lock means 15 is provided for detecting zero voltage phase (zero-cross point) of the phase shift voltage waveform 13. The phase shift voltage waveform threshold generating means 5 generates, in synchronization with the second phase lock means 15, a phase shift voltage waveform threshold 14 serving as a voltage dip determination criterion with respect to the phase shift voltage waveform 13. The remaining part is arranged in the same manner as in FIG. 1, and the same reference numerals are designated to the same elements omitting further description.

In this Embodiment 2, even if there is any variation in phase shift amount of the phase shift means 2, since a threshold is generated by the phase shift voltage waveform threshold generating means 5 on the basis of zero voltage phase of the output voltage waveform of the phase shift means 2, the variation in phase shift amount can be compensated, and stable and constant detection can be performed.

Embodiment 3

Figure 5:
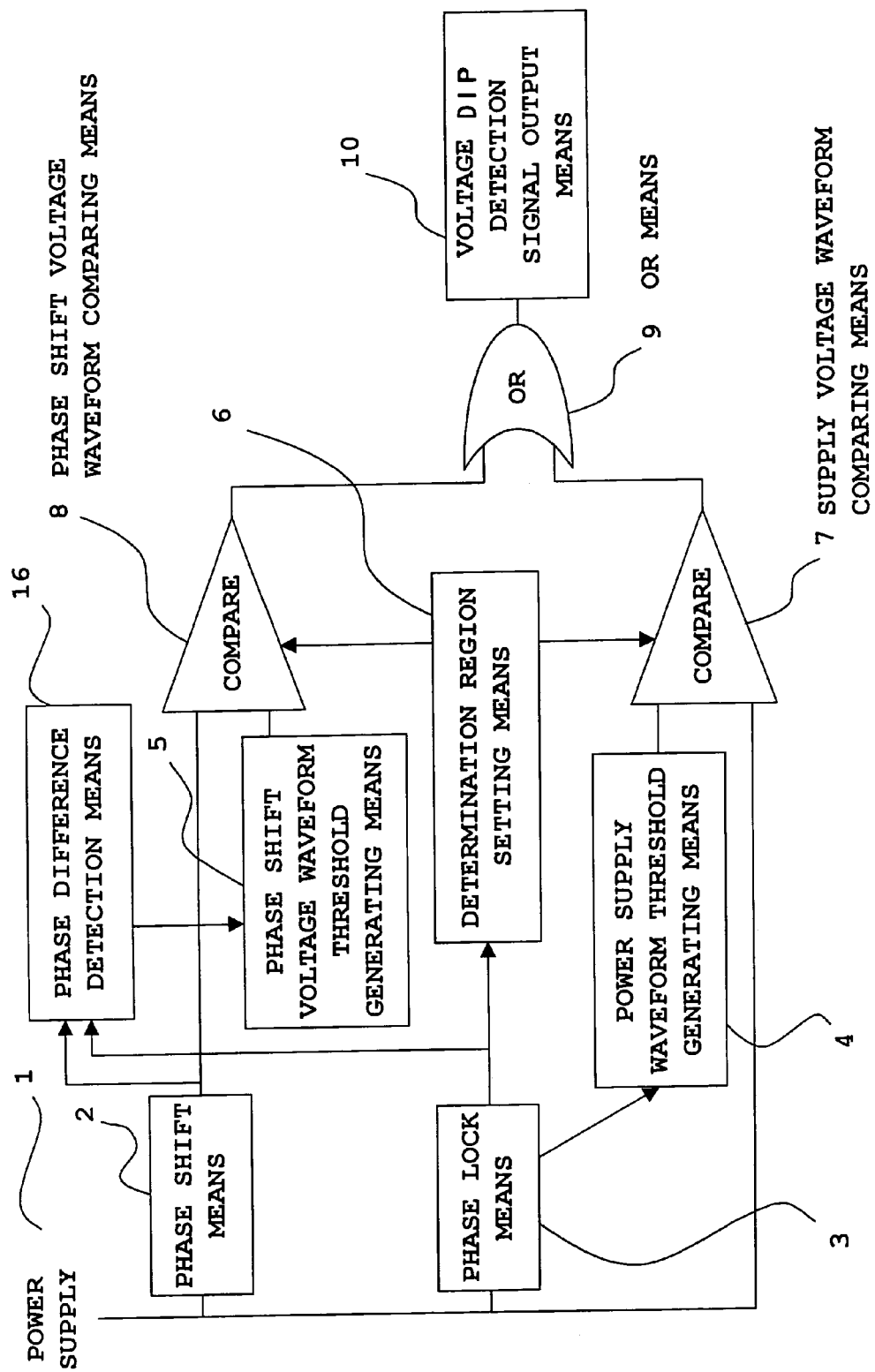
FIG. 5 is a block diagram showing an instantaneous voltage dip detection device according to Embodiment 3 of the invention.

FIG. 5 is a block diagram showing an instantaneous voltage dip detection device according to Embodiment 3 of the invention. In this Embodiment 3, phase difference detection means 16 is provided. The phase difference detection means 16 detects zero voltage phase of the phase shift voltage waveform 13, and a difference from zero voltage phase (zero-cross point) of the supply voltage waveform 11 obtained from the phase lock means 3 is obtained. The phase shift voltage waveform threshold generating means 5 generates, in synchronization with the phase difference detection means 16, a phase shift voltage waveform threshold 14 serving as a voltage dip determination criterion with respect to the phase shift voltage waveform 13. The remaining part is arranged in the same manner as in FIG. 1, and the same reference numerals are designated to the same elements omitting further description.

In this Embodiment 3, even if there is any variation in phase shift amount of the phase shift means 2, a phase difference from the phase lock means 3 is detected by the phase difference detection means 16 and a phase of the threshold generated by the phase shift voltage waveform threshold generating means 5 is controlled by the output thereof. Therefore, even if there is any variation in phase shift amount of the phase shift means 2, the variation in phase shift amount can be compensated, and stable and constant detection can be performed.

Embodiment 4

In this embodiment, referring to the arrangements shown in FIGS. 1, 4 and 5, the supply voltage waveform comparing means 7 and the phase shift voltage waveform comparing means 8 have a counter function not shown, and a voltage dip detection signal is generated only when it is determined that a voltage dip is generated continuously for a predetermined time set in the counter function. Malfunction due to noise can be effectively prevented. It is preferable that the counter function is provided with the logic addition (OR) means 9.

Embodiment 5

Figure 6:
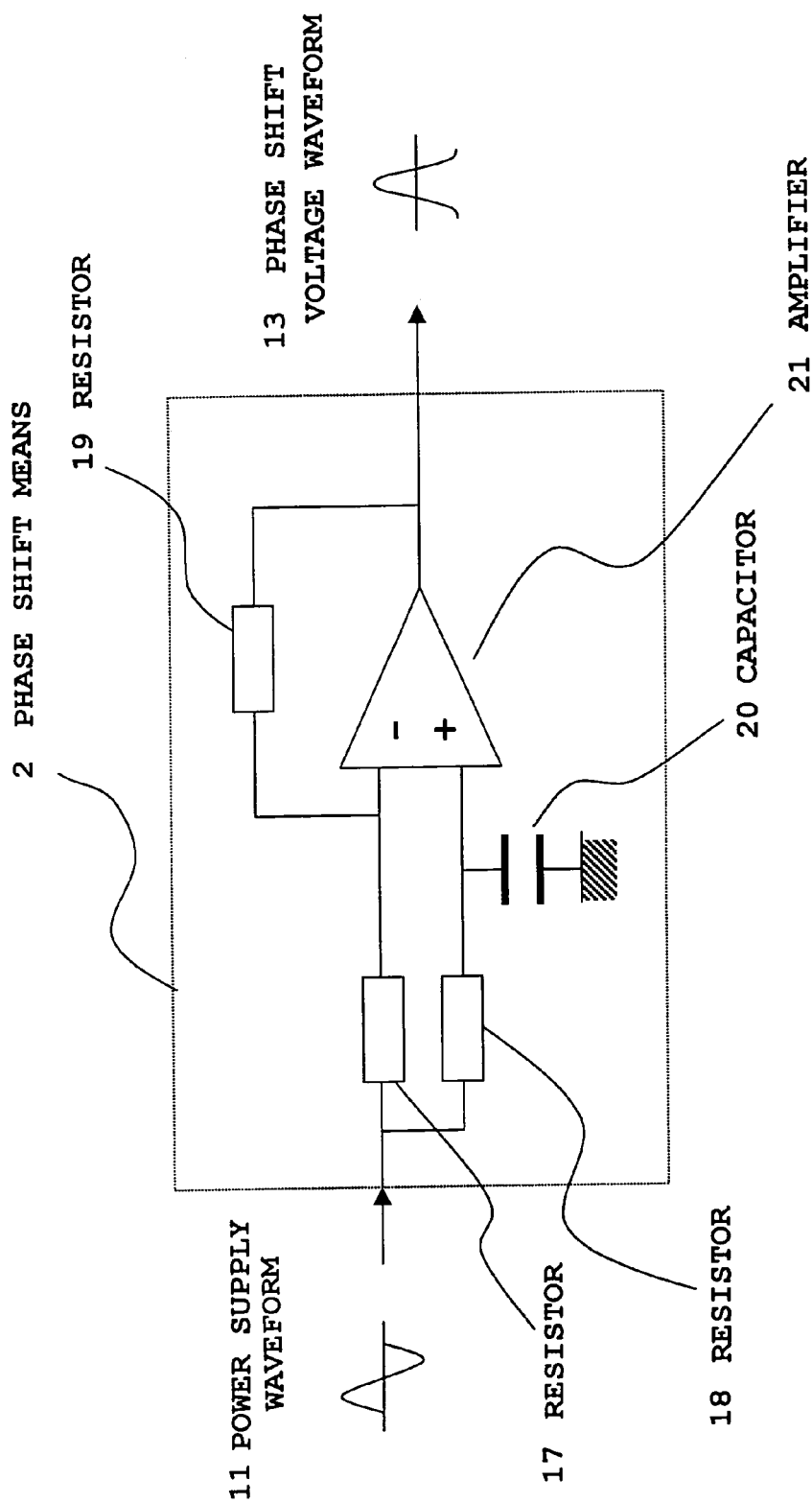
FIG. 6 is a block diagram showing phase shifting means of an instantaneous voltage dip detection device in detail according to Embodiment 5 of the invention.

FIG. 6 is a block diagram showing in detail phase shifting means employed in an instantaneous voltage dip detection device according to Embodiment 5 of the invention. The phase shift means 2 is an all-pass filter consisting of resistors 17, 18, 19, a capacitor 20 and an amplifier 21. Shifting operation is determined depending on a value (time constant CR) between the resistor 18 (constant R) and the capacitor 20 (constant C). In order to set a shift angle to be within a range of 20° to 160°, the circuit constant value $1/(2\pi CR)$ is set to be within a range of 8 to 340. Each of the resistors and the capacitor is set to a value for phase shifting the supply voltage waveform 11 of which supply voltage cycle is 55 Hz by about 90°, for example.

Generally, a differentiation circuit is sometimes employed as a method of phase shifting a waveform by 90°. However, in the case of using a differentiation circuit, a gain of high frequency component contained in the supply voltage waveform becomes large, and a waveform of which out of alignment is large and which is not suitable for the voltage dip detection is outputted (for example, see a phase shift voltage waveform 13b at the time of superimposition of harmonics shown in FIG. 8). To suppress this variation in waveform, it may be an idea to combine a low-pass filter circuit. In this case, however, a problem exists in that the low-pass filter may extinguish the sharp variation of the waveform generated at the time of voltage dip, thereby taking much time in the detection.

According to this Embodiment 5, since an all-pass filter consisting of resistors, capacitor and amplifier is used as phase shift means, it becomes possible to establish the supply voltage waveform 11 and the gain of the phase shift voltage waveform 13 after the phase shifting by about 90° to be almost equal. There is no need of reducing such a gain by combining a low-pass filter circuit to eliminate the high frequency component as is required in the case of using a differentiation circuit. Thus, an advantage exists in that a phase shift waveform can be generated with a simple circuit arrangement.

Embodiment 6

Figure 7:
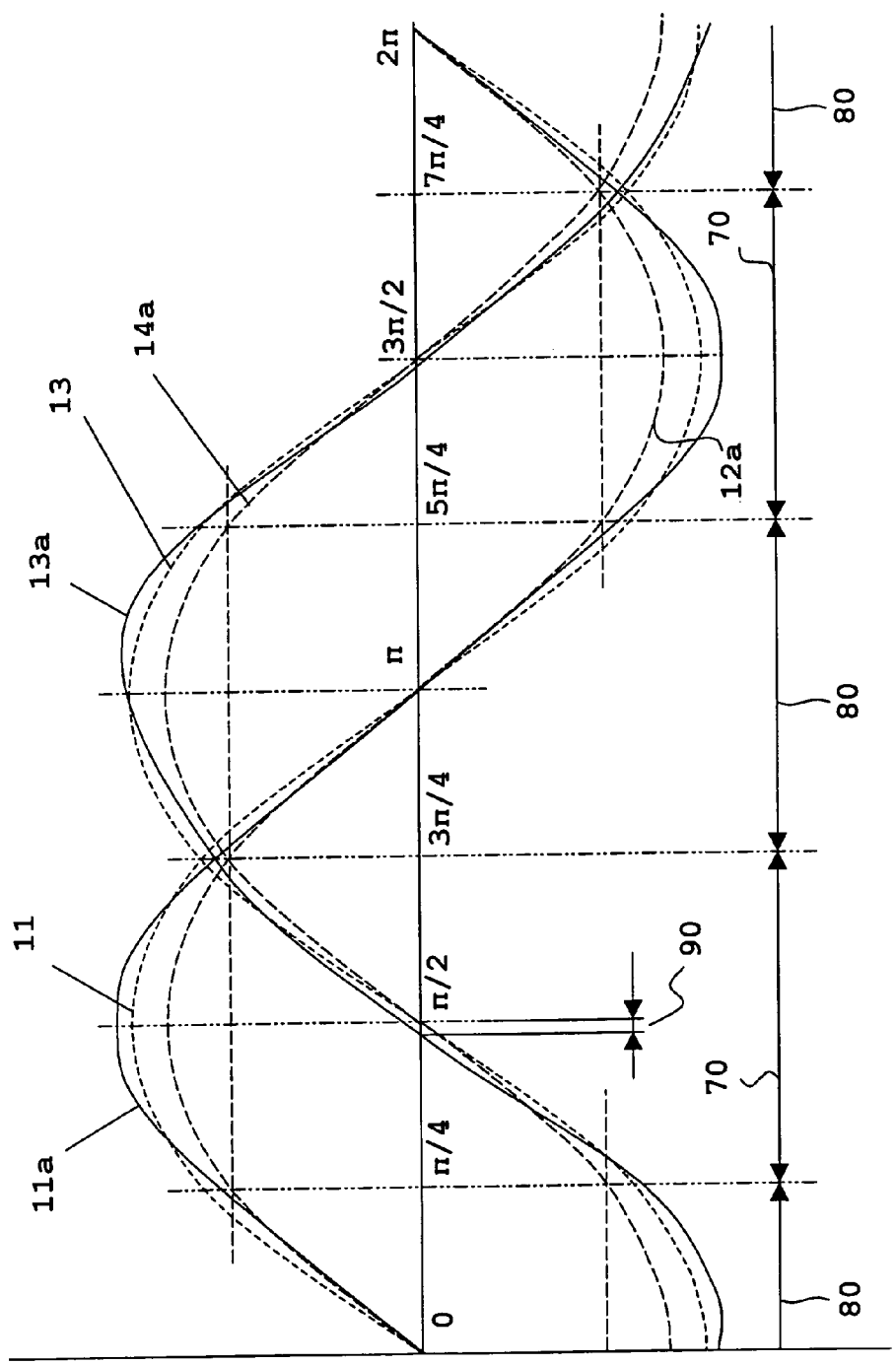
FIG. 7 is a waveform diagram showing phase shift voltage waveforms according Embodiment 5 of the invention, and in which phase is inverted by 180 degree and harmonics are superimposed by 5% using an all-pass filter.
Figure 8:
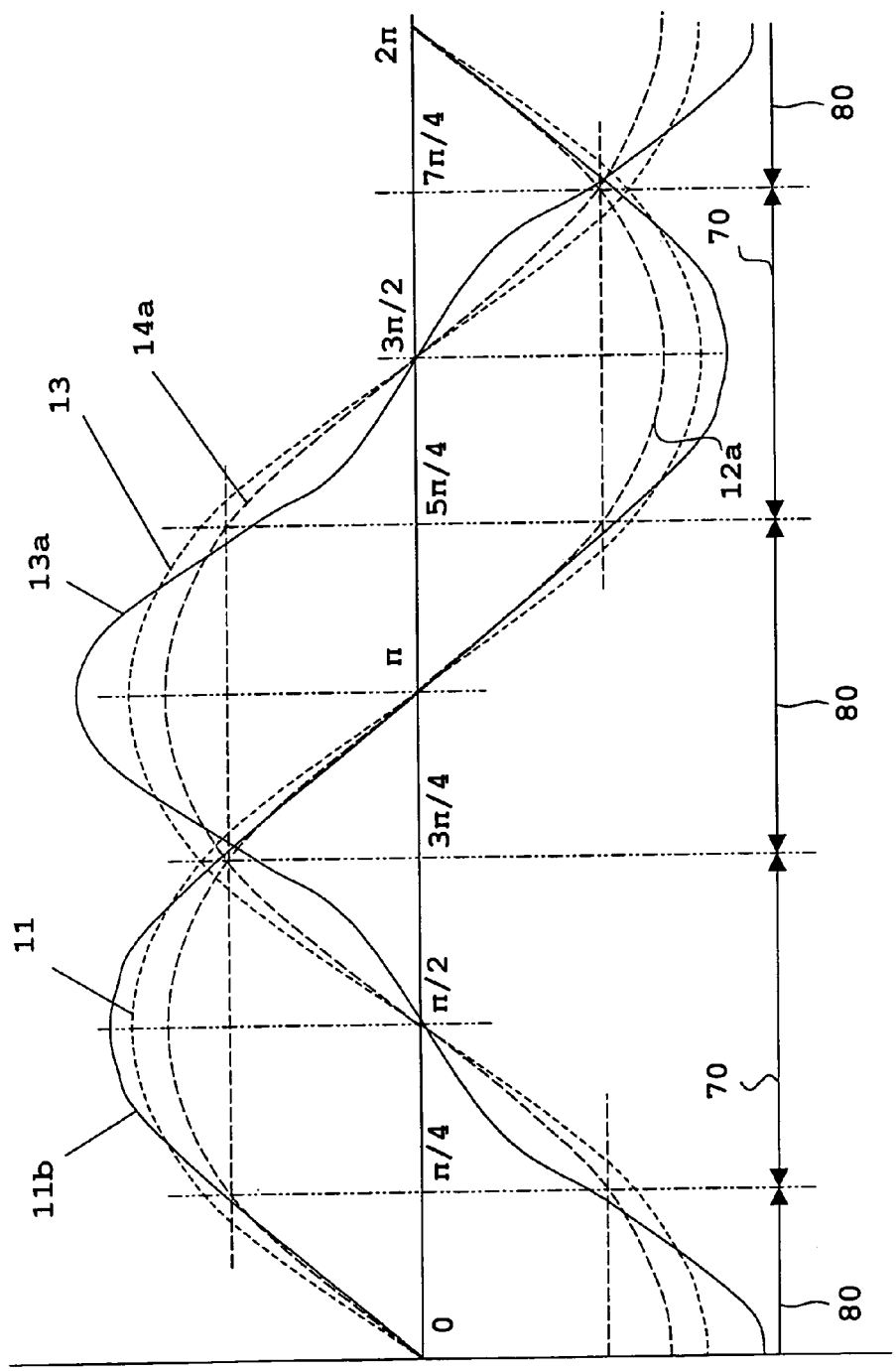
FIG. 8 is a waveform diagram showing phase shift voltage waveforms according to a comparative example with FIG. 7, and in which phase is inverted by 180 degree and harmonics are superimposed by 5% using differentiation circuit.

This embodiment shows an example of circuit arrangement of FIG. 5 in which the phase shift means 2 including an all-pass filter of FIG. 6 is used. FIG. 7 shows a phase shift voltage waveform 13a in which third harmonic (of which phase is inverted by 180 degree) is superimposed by 5% using an all-pass filter as phase shift means as shown in FIG. 5. FIG. 8 shows, as a comparative example, a phase shift voltage waveform 13b in which third harmonic (of which phase is inverted by 180 degree) is superimposed by 5% using a differentiation circuit as phase shift means. For reasons of convenience, the threshold 12a and threshold 14a are the same as in FIG. 7.

In this Embodiment, the phase difference detection means 16 of FIG. 5 has a recording function and harmonics level determination function.

Referring to FIG. 7, by detecting a difference (phase shift) between a phase value in the mentioned recording function that records a zero voltage phase of the phase shift voltage waveform 13 at the normal time when no harmonics are superimposed on the supply voltage and a zero voltage phase of the phase shift voltage waveform 13a, the mentioned harmonics level determination function determines a level of harmonics. By a command of the harmonics level determination function, the phase shift voltage waveform threshold generating means 5 generates a threshold 14a that is reduced by 2% as compared with the normal time. For example, supposing that a threshold when harmonics are zero is $160\sqrt{2}$, the threshold 14a when the harmonics are superimposed by 5% is $157\sqrt{2}(160\times 0.98\ \sqrt{2})$.

Specifically, in the case of using an all-pass filter shown in FIG. 6, due to circuit arrangement thereof, when the harmonics are superimposed, although the absolute value of the voltage waveform 13a after the phase shift is almost the same as that of the normal time phase shift voltage waveform 13, there arises a phase shift 90. Utilizing this phenomenon, level of the harmonics are detected. On the other hand, as shown in FIG. 8, in the case of using a differentiation circuit, due to circuit arrangement thereof, when the harmonics are superimposed, although there arises substantially no phase shift, the absolute value of the voltage waveform 13a after the phase shift has a large variation in waveform thereof as compared with that of the normal time phase shift voltage waveform 13.

Therefore accuracy in the detection of instantaneous voltage dip is lowered as compared with that in FIG. 7.

According to Embodiment 6 of the invention, even in the case of superimposing the harmonics on the supply voltage, level of the harmonics are detected and threshold is reduced, thereby making it possible to perform a stable detection of voltage dip.

Embodiment 7

This embodiment relates to an instantaneous voltage dip detection device of which circuit arrangement is based on FIGS. 1, 4 and 5. In this Embodiment 7, the power supply waveform threshold generating means 4 and the phase shift voltage waveform threshold generating means 5 have a waveform recording function. Referring to FIG. 4, this waveform recording function records sequentially the supply voltage waveform 11 or the phase shift voltage waveform 13 in synchronization with the phase lock means 3 or the second phase lock means 15.

A predetermined value, for example, 20% of a recorded value is added to or subtracted from the recorded supply voltage waveform 11 or phase shift voltage waveform 13 to obtain an upper limit threshold and a lower limit threshold. For example, a value of which waveform is shifted by ±20% with respect to the previous waveform is established as an upper limit threshold and a lower limit threshold.

The supply voltage waveform comparing means 7 and phase shift voltage waveform comparing means 8 determines that an instantaneous voltage dip has occurred when the supply voltage waveform 11 or phase shift voltage waveform 13 varies over the mentioned upper limit threshold and the lower limit threshold.

In this manner, an advantage is obtained such that even under the condition that determination of a threshold is difficult, it is possible to perform a stable detection of voltage dip. Although 20% is taken as a predetermined value is in the foregoing description, the percentage can be changed depending upon the phase.

Embodiment 8

Figure 9:
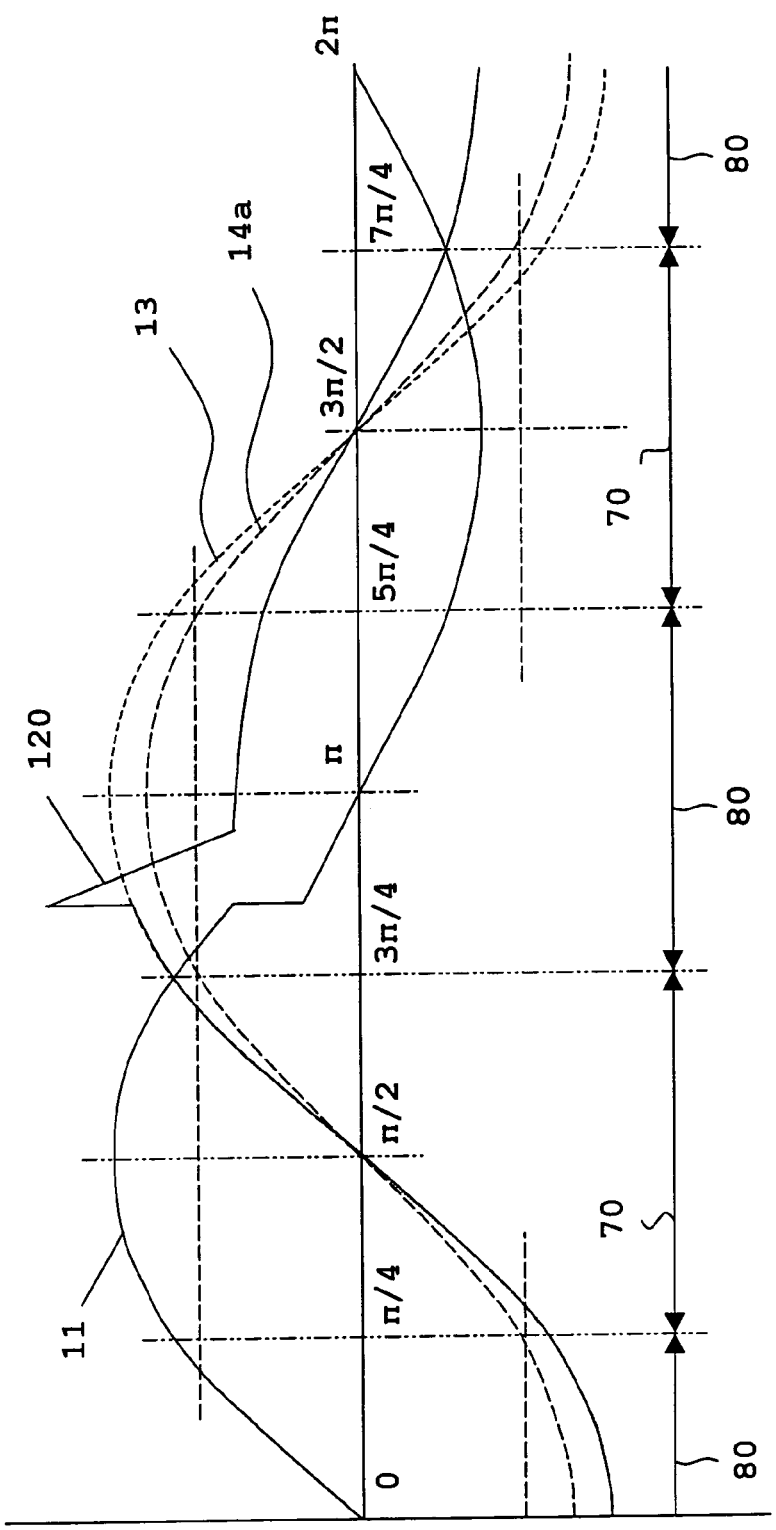
FIG. 9 is a waveform diagram showing transient waveforms at the time of occurrence of an instantaneous voltage dip of the phase shift means by the instantaneous voltage dip detection device in detail according to Embodiment 5 of the invention.

This embodiment relates to an instantaneous voltage dip detection device of the circuit arrangement shown in FIG. 5. FIG. 9 shows a transient waveform at the time of generating an instantaneous voltage dip of the phase shift means 2 according to the foregoing Embodiment 5 of the invention.

In the phase shift means 2 according to Embodiment 5 (see FIG. 6), when occurring a sharp instantaneous voltage dip at a predetermined phase, for example, at $3\pi/4$ to $\pi$, a transient phenomenon 120 of the phase shift voltage waveform is generated, in which phase shift voltage waveform 13 swings in the opposite direction of the phase shift voltage waveform threshold 14 (voltage rising direction, i.e., positive direction).

At this predetermined phase, the phase shift voltage waveform threshold generating means 5 generates not only a determination threshold of voltage dip but also a determination threshold of voltage rising, and the phase shift voltage waveform comparing means 8 determines the voltage dip based on both of the mentioned thresholds. In the case of a sharp change in voltage, the determination is carried out based on the voltage rising threshold and in the case of a slow change in voltage, the determination is carried out based on the voltage dip threshold.

According to this Embodiment 8, an advantage is obtained such that it is possible to perform a speedy detection of instantaneous voltage dip over a wide range of phase.

Embodiment 9

This embodiment relates to an instantaneous voltage dip detection device of the circuit arrangement shown in FIG. 5. In this Embodiment 9, phase shift voltage waveform threshold generating means 5 have a waveform recording function. This waveform recording function records sequentially the phase shift voltage waveform 13 in synchronization with the phase difference detection means 16.

At a voltage dip determination threshold and at a predetermined phase, for example, at $3\pi/4$ to $\pi$, the phase shift voltage waveform threshold generating means 5 determines a voltage rising determination threshold by adding or subtracting a predetermined value to or from a recorded waveform value of the recorded phase shift voltage waveform 13, for example, 20% of the value. The phase shift voltage waveform comparing means 8 determines a voltage dip based on the mentioned both thresholds. In the case of a sharp change in voltage, the determination is carried out based on the voltage rising threshold and in the case of a slow change in voltage, the determination is carried out based on the voltage dip threshold. Although 20% is taken as a predetermined value is in the foregoing description, the percentage can be changed depending upon the phase.

According to this Embodiment 9, an advantage is obtained such that it is possible to perform a speedy detection of instantaneous voltage dip over a wide range of phase.

Embodiment 10

Figure 10:
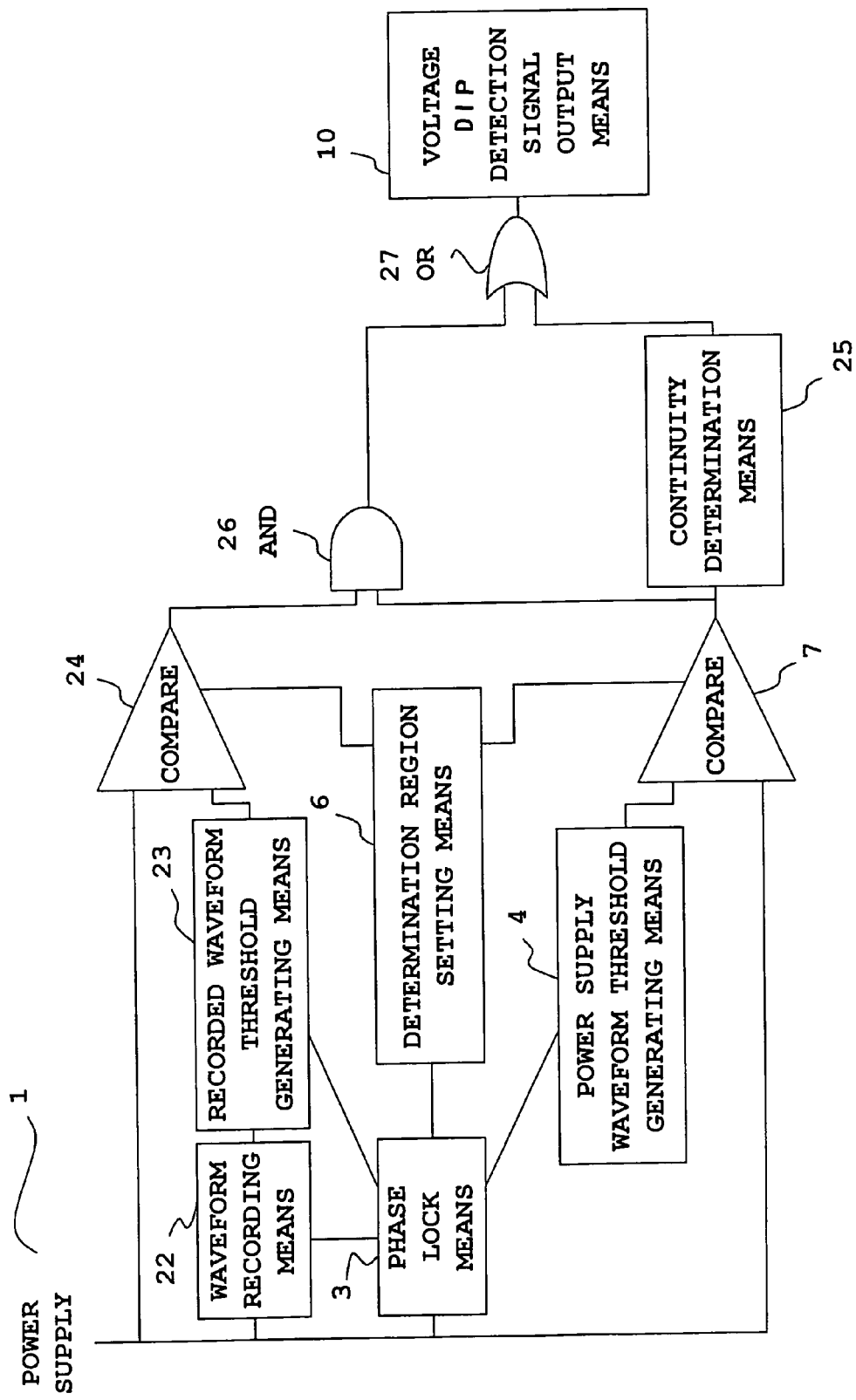
FIG. 10 is a block diagram showing an instantaneous voltage dip detection device according to Embodiment 10 of the invention.

FIG. 10 is a block diagram showing an instantaneous voltage dip detection device according to Embodiment 10 of the invention.

In this Embodiment 10, a phase lock means 3 is provided for detecting zero voltage phase (zero-cross point) of the supply voltage waveform 11 which is a signal waveform of the supply voltage 1. In synchronization with an output of this phase lock means 3, the supply voltage waveform threshold generating means 4 generates the supply voltage waveform threshold 12 acting as a voltage dip determination reference with respect to the supply voltage waveform 11.

The supply voltage waveform comparing means 7 determines that an instantaneous voltage dip has occurred, in the case where the supply voltage waveform 11 is below the supply voltage waveform threshold (i.e., goes down beyond the threshold in the direction of AC zero voltage) in a region where the determination region setting means 6 has determined a comparative determination effective region (for example, $\pi/10$ to $9\pi/10$, $11\pi/10$ to $19\pi/10$).

Waveform recording means 22 records sequentially the supply voltage waveform in synchronization with the phase lock means 3, and recorded waveform threshold generating means 23 establishes an upper limit threshold and a lower limit threshold by adding and/or subtracting a predetermined value, for example, 20% based on a recorded waveform value of the recorded supply voltage waveform. For example, a value of which waveform is shifted by ±20% with respect to the previous waveform is established as an upper limit threshold and a lower limit threshold. a value of which waveform is shifted by ±20% with respect to the previous waveform. Although the same value is taken as a predetermined value over the all phase region in the foregoing description, any value different depending upon the phase can be set.

Recorded waveform comparing means 24 determines that an instantaneous voltage dip has occurred in the case where the supply voltage waveform 11 has changed over the mentioned upper limit threshold and lower limit threshold in a region where the mentioned determination region setting means 6 determines as being a comparative determination effective region. In this regard, although both upper limit threshold and lower limit threshold are used, it is preferable to use only the lower limit threshold.

Continuity determination means 25 determines that a voltage dip in which voltage is reduced gently has occurred in the case where the supply voltage waveform comparing means 7 has determined occurrence of an instantaneous voltage dip continuously for a predetermined time period (for example, for ¼ cycle).

Logical multiplication (AND) means 26 determines that an instantaneous voltage dip has occurred in the case where both recorded waveform comparing means 24 and supply voltage waveform comparing means 7 have determined occurrence of an instantaneous voltage dip. Thus, an advantage is such that even in the case where high harmonics are mixed at a high level and occurrence of an instantaneous voltage dip is erroneously determined in the voltage waveform comparison, the recorded waveform comparing means 24 determines the voltage dip rightly, enabling to perform a stable voltage dip detection. In the case of very gentle voltage reduction, there may be a case where a difference between the current waveform and the waveform preceding by 1 cycle is so small that the recorded waveform comparing means 24 cannot determine the voltage dip. Even in such a case, the continuity determination means 25 can detect the voltage dip.

Logical addition (OR) means 27 determines that an instantaneous voltage dip has occurred when either the logical multiplication (AND) means 26 or the continuity determination means 25 has determined occurrence of an instantaneous voltage dip.

As a result, even in the case where harmonics are mixed at a high level and an instantaneous voltage dip of gentle voltage has occurred, it is possible to perform a stable detection.

Embodiment 11

Figure 11:
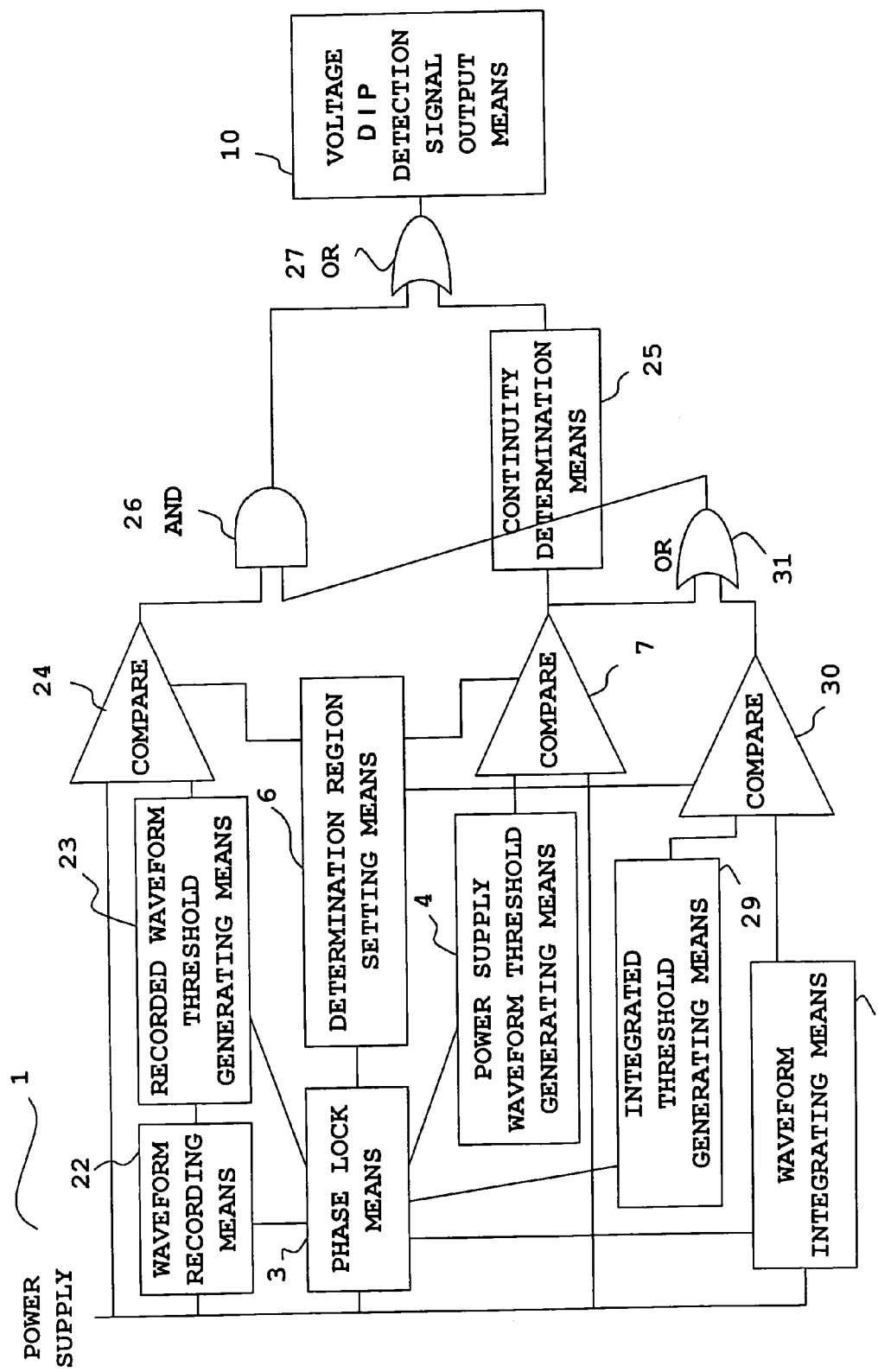
FIG. 11 is a block diagram showing an instantaneous voltage dip detection device according to Embodiment 11 of the invention.

FIG. 11 is a block diagram showing an instantaneous voltage dip detection device according to Embodiment 11 of the invention.

In this Embodiment 11, a phase lock means 3 is provided for detecting zero voltage phase (zero-cross point) of the supply voltage waveform 11 that is a signal waveform of the supply voltage 1. In synchronization with an output of this phase lock means 3, the supply voltage waveform threshold generating means 4 generates the supply voltage waveform threshold 12 acting as a voltage dip determination reference with respect to the supply voltage waveform 11.

The supply voltage waveform comparing means 7 determines that an instantaneous voltage dip has occurred, in the case where the supply voltage waveform 11 is below the supply voltage waveform threshold (i.e., goes down beyond the threshold in the direction of AC zero voltage in a region where the determination region setting means 6 has determined a comparative determination effective region (for example, $\pi/10$ to $9\pi/10$, $11\pi/10$ to $19\pi/10$).

Waveform recording means 22 records sequentially the supply voltage waveform in synchronization with the phase lock means 3, and recorded waveform threshold generating means 23 establishes an upper limit threshold and a lower limit threshold by adding and/or subtracting a predetermined value, for example, 20% based on a recorded waveform value of the recorded supply voltage waveform. For example, a value of which waveform is shifted by ±20% with respect to the previous waveform is established as an upper limit threshold and a lower limit threshold. Although the same value is taken as a predetermined value over the all phase region in the foregoing description, any value different depending upon the phase can be set.

Recorded waveform comparing means 24 determines that an instantaneous voltage dip has occurred in the case where the supply voltage waveform 11 has changed over the mentioned upper limit threshold and lower limit threshold in a region where the mentioned determination region setting means 6 determines as being a comparative determination effective region. In this regard, although both upper limit threshold and lower limit threshold are used, it is preferable to use only the lower limit threshold.

Continuity determination means 25 determines that a voltage dip in which voltage is reduced gently has occurred in the case where the supply voltage waveform comparing means 7 has determined occurrence of an instantaneous voltage dip continuously for a predetermined time period (for example, for ¼ cycle).

Waveform integrating means 28, in synchronization with the phase lock means 3, integrates and outputs a predetermined calculation value (for example, absolute value) of the supply voltage waveform 11 during the phase of 0 to $\pi/10$, $9\pi/10$ to $\pi$, $19\pi/10$ to $2\pi$ being near zero voltage phase.

Integrated threshold generating means 29 generates an integrated value during the mentioned phase (in this case 0 to $\pi/10$, $9\pi/10$ to $\pi$, $19\pi/10$ to $2\pi$) of sine wave of a voltage value detected as an instantaneous voltage dip, the integrated value being an integration waveform threshold serving as a voltage dip determination reference. The integration waveform threshold is preferably selected so that noise detection sensitivity is low as compared with the recorded waveform threshold from the viewpoint of preventing malfunction due to noise because there are much noise components in the region near zero voltage phase. For example, it is preferable that the integrated waveform threshold is established to be a value that is 50% of a value of an ideal waveform or previous waveform.

Integrated value comparing means 30 determines that an instantaneous voltage dip has occurred in the case that an output of the waveform integrating means 28 is below the integrated waveform threshold (i.e., goes down beyond the threshold in the direction of AC zero voltage) in a region where the determination region setting means 6 has determined a comparative determination effective region (in this case, 0 to $\pi/10$, $9\pi/10$ to $\pi$, $19\pi/10$ to $2\pi$).

Logical addition (OR) means 31 determines that an instantaneous voltage dip has occurred when either the voltage waveform comparing means 7 or the integrated value comparing means 30 has determined occurrence of an instantaneous voltage dip.

The logical multiplication (AND) means 26 determines that an instantaneous voltage dip has occurred in the case where both recorded waveform comparing means 24 and logical addition (OR) means 31 have determined occurrence of an instantaneous voltage dip.

In the region near zero voltage phase, influence of noise can re reduced by integration, enabling to perform stable voltage dip detection. Furthermore, an advantage is such that even in the case where harmonics are mixed at a high level and occurrence of an instantaneous voltage dip is erroneously determined in the voltage waveform comparison, the recorded waveform comparing means 24 determines the voltage dip rightly, enabling to perform a stable voltage dip detection. In the case of very gentle voltage reduction, there may be a case where a difference between the current waveform and the waveform preceding by 1 cycle is so small that the recorded waveform comparing means 24 cannot determine the voltage dip. Even in such a case, the continuity determination means 25 can detect the voltage dip.

Logical addition (OR) means 27 determines that an instantaneous voltage dip has occurred when either the logical multiplication (AND) means 26 or the continuity determination means 25 has determined occurrence of an instantaneous voltage dip.

As a result, even in the case where harmonics are mixed at a high level and an instantaneous voltage dip of gentle voltage has occurred, it is possible to perform a stable detection.

INDUSTRIAL APPLICABILITY

The present invention enables a voltage dip to be detected at a high speed, and is effective for detection of instantaneous voltage dip in distribution network occurring due to lightning.

What is claimed is:

1. An instantaneous voltage dip detection device comprising:
   phase shifting means for shifting a supply voltage waveform by a predetermined angle and generating a phase shift voltage waveform;
   phase lock means for detecting the zero voltage phase of the supply voltage waveform;
   supply voltage waveform threshold generating means for generating a supply voltage waveform threshold acting as a voltage dip determination reference with respect to said supply voltage waveform in synchronization with said phase lock means;
   phase shift voltage waveform threshold generating means for generating a phase shift voltage waveform threshold acting as a voltage dip determination reference with respect to said phase shift voltage waveform;
   determination region setting means for setting a part or all of absolute values of said supply voltage waveform threshold and phase shift voltage waveform threshold that are larger than a predetermined value as being a comparative determination effective region;

supply voltage waveform comparing means for outputting a voltage dip detection signal based on the comparison between said supply voltage waveform and the supply voltage waveform threshold, in the case where said determination region setting means determines as being a comparative determination effective region of the supply voltage waveform; and phase shift voltage waveform comparing means for outputting a voltage dip detection signal based on the comparison between said phase shift voltage waveform and the phase shift voltage waveform threshold, in the case where said determination region setting means determines as being a comparative determination effective region of the phase shift voltage waveform.

2. The instantaneous voltage dip detection device according to claim 1, wherein said phase shift voltage waveform is a waveform shifted from the zero voltage phase of the supply voltage waveform by 90°.

3. The instantaneous voltage dip detection device according to claim 2 further comprising second phase lock means that detects the zero voltage phase of the supply voltage waveform, wherein said phase shift voltage waveform threshold generating means generates, in synchronization with second phase lock means, a phase shift voltage waveform threshold serving as a voltage dip determination reference with respect to a phase shift voltage waveform.

4. The instantaneous voltage dip detection device according to claim 3, wherein said supply voltage waveform comparing means and the phase shift voltage waveform comparing means include a counter function, and utilizing said counter function, a voltage dip detection signal is generated only in the case where it is determined that a voltage dip occurs continuously for a predetermined time period.

5. The instantaneous voltage dip detection device according to claim 2 further comprising phase difference detection means that detects the zero voltage phase of the supply voltage waveform and obtains a phase difference from the zero voltage phase of the supply voltage waveform obtained from said phase lock means, wherein said phase shift voltage waveform threshold generating means generates, in synchronization with said phase difference detection means, a phase shift voltage waveform threshold serving as a voltage dip determination reference with respect to a phase shift voltage waveform.

6. The instantaneous voltage dip detection device according to claim 5, wherein said supply voltage waveform comparing means and the phase shift voltage waveform comparing means include a counter function, and utilizing said counter function, a voltage dip detection signal is generated only in the case where it is determined that a voltage dip occurs continuously for a predetermined time period.

7. The instantaneous voltage dip detection device according to claim 2, wherein said supply voltage waveform comparing means and the phase shift voltage waveform comparing means include a counter function, and utilizing said counter function, a voltage dip detection signal is generated only in the case where it is determined that a voltage dip occurs continuously for a predetermined time period.

8. The instantaneous voltage dip detection device according to claim 1 further comprising second phase lock means that detects the zero voltage phase of the supply voltage waveform, wherein said phase shift voltage waveform threshold generating means generates, in synchronization with said second phase lock means, a phase shift voltage waveform threshold serving as a voltage dip determination reference with respect to a phase shift voltage waveform.

9. The instantaneous voltage dip detection device according to claim 8, wherein said Supply voltage waveform comparing means and the phase shift voltage waveform comparing means include a counter function, and utilizing said counter function, a voltage dip detection a signal is generated only in the case where it is determined that a voltage dip occurs continuously for a predetermined time period.

10. The instantaneous voltage dip detection device according to claim 1 further comprising phase difference detection means that detects the zero voltage phase of the supply voltage waveform and obtains a phase difference from the zero voltage phase of the supply voltage waveform obtained from said phase lock means, wherein said phase shift voltage waveform threshold generating means generates, in synchronization with said phase difference detection means, a phase shift voltage waveform threshold serving as a voltage dip determination reference with respect to a phase shift voltage waveform.

11. The instantaneous voltage dip detection device according to claim 10, wherein said supply voltage waveform comparing means and the phase shift voltage waveform comparing means include a counter function, and utilizing said counter function, a voltage dip detection signal is generated only in the case where it is determined that a voltage dip occurs continuously for a predetermined time period.

12. The instantaneous voltage dip detection device according to, claim 1, wherein said supply voltage waveform comparing means and the phase shift voltage waveform comparing means include a counter function, and utilizing said counter function, a voltage dip detection signal is generated only in the case where it is determined that a voltage dip occurs continuously for a predetermined time period.

13. An instantaneous voltage dip detection device comprising:
    phase shifting means for shifting a supply voltage waveform by a predetermined angle and generating a phase shift voltage waveform;
    phase lock means for detecting the zero voltage phase of the supply voltage waveform;
    supply voltage waveform threshold generating means for generating a supply voltage waveform threshold acting as a voltage dip determination reference with respect to said supply voltage waveform in synchronization with said phase lock means;
    phase shift voltage waveform threshold generating means for generating a phase shift voltage waveform threshold acting as a voltage dip determination reference with respect to said phase shift voltage waveform;
    determination region setting means for setting a part or all of absolute values of said supply voltage waveform threshold and phase shift voltage waveform threshold that are larger than a predetermined value as being a comparative determination effective region;
    supply voltage waveform comparing means for outputting a voltage dip detection signal based on the comparison between said supply voltage waveform and the supply voltage waveform threshold, in the case where said determination region setting means determines as being a comparative determination effective region of the supply voltage waveform; and
    phase shift voltage waveform comparing means for outputting a voltage dip detection signal based on the comparison between said phase shift voltage waveform and the phase shift voltage waveform threshold, in the case where said determination region setting means determines as being a comparative determination effective region of the phase shift voltage waveform;

wherein said phase shift means is an all-pass filter consisting of resistors, capacitor and amplifier, and a circuit constant value $1/(2\pi CR)$ for carrying out phase shift operation is set to be within a range of 8 to 340.

14. The instantaneous voltage dip detection device according to claim 13 further comprising phase difference detection means for detecting the zero voltage phase of said phase shift voltage waveform and obtaining a phase difference from the zero voltage phase of the supply voltage waveform obtained from said phase lock means;

wherein said phase difference detection means has a recording function for preliminarily recording the zero voltage phase of the phase shift voltage waveform at the normal time when no harmonics are superimposed on the supply voltage, and harmonics level determination function for determining a level of harmonics based on a phase shift quantity being a difference between the zero voltage phase of the phase shift voltage waveform on which harmonics are superimposed and the zero voltage phase of the phase shift voltage waveform at the normal time recorded by said recording means; and by a command of the harmonics level determination function, the phase shift voltage waveform threshold generating means generates a threshold conforming to a level of the harmonics.

15. The instantaneous voltage dip detection device according to claim 13, wherein said power supply waveform threshold generating means and the phase shift voltage waveform threshold generating means have a waveform recording function to obtain an upper limit threshold and a lower limit threshold by a predetermined calculation based on recorded waveforms; said supply voltage waveform comparing means makes a comparison between said supply voltage waveform and the supply voltage waveform threshold at a predetermined phase and outputs a voltage dip detection signal when being smaller than the lower limit threshold on the positive side of the phase and when being larger than the upper limit threshold on the negative side of the phase; and phase shift voltage waveform comparing means makes a comparison between said phase shift voltage waveform and the phase shift voltage waveform threshold at a predetermined phase and outputs a voltage dip detection signal when being smaller than the lower limit threshold or larger than the upper limit threshold on the positive side of the phase, and when being larger than the lower limit threshold or smaller than the upper limit threshold on the negative side of the phase on the negative side of the phase.

16. The instantaneous voltage dip detection device according to claim 13, wherein said phase shift voltage waveform threshold generating means establishes also a voltage rising determination reference value with respect to a phase shift voltage waveform as a threshold at a predetermined phase; said supply voltage waveform comparing means makes a comparison between said phase shift voltage waveform and a voltage dip determination reference threshold of the phase shift voltage waveform in the case where said determination region setting means determines as being a comparative determination effective region of the phase shift voltage waveform, outputs a voltage dip detection signal when being smaller on the positive side of the phase and when being larger on the negative side of the phase; and in said predetermined phase, said supply voltage waveform comparing means makes a comparison between said phase shift voltage waveform and the voltage rising determination reference threshold, and outputs a voltage dip detection signal when being larger on the positive side of the phase and when being smaller on the negative side of the phase.

17. The instantaneous voltage dip detection device according to claim 13, wherein said phase shift voltage waveform threshold generating means has a recording function to record sequentially the phase shift voltage waveform, establishes a voltage dip determination reference value with respect to said phase shift voltage waveform and a voltage rising determination reference value obtained by adding a predetermined value to a recorded waveform of an instantaneous value of the phase shift voltage waveform at a predetermined phase as a threshold; said supply voltage waveform comparing means makes a comparison between said phase shift voltage waveform and a voltage dip determination reference threshold of the phase shift voltage waveform in the case where said determination region setting means determines as being a comparative determination effective region of the phase shift voltage waveform, outputs a voltage dip detection signal when being smaller on the positive side of the phase and when being larger on the negative side of the phase; and in said predetermined phase, said supply voltage waveform comparing means makes a comparison between said phase shift voltage waveform and the voltage rising determination reference threshold, and outputs a voltage dip detection signal when being larger on the positive side of the phase and when being smaller on the negative side of the phase.

18. An instantaneous voltage dip detection device comprising:

phase lock means for detecting the zero voltage phase of the supply voltage waveform;

supply voltage waveform threshold generating means for generating a supply voltage waveform threshold acting as a voltage dip determination reference with respect to said supply voltage waveform in synchronization with said phase lock means;

waveform recording means for recording sequentially supply voltage waveforms in synchronization with said phase lock means;

recorded waveform threshold generating means for generating a lower limit threshold or an upper limit threshold by a predetermined calculation based on said recorded waveforms;

determination region setting means for setting a comparative determination effective region in synchronization with said phase lock means;

supply voltage waveform comparing means for outputting a voltage dip detection signal based on the comparison between said supply voltage waveform and the supply voltage waveform threshold, in the case where said determination region setting means determines as being a comparative determination effective region of the supply voltage waveform;

recorded waveform comparing means for outputting a voltage dip detection signal based on the comparison between said supply voltage waveform and the recorded waveform threshold, in the case where said determination region setting means determines as being a comparative determination effective region of the recorded waveform;

continuity determination means for determining that said supply voltage waveform comparing means outputs the voltage dip detection signal continuously for a predetermined time period;

logical multiplication (AND) means between an output of said supply voltage waveform comparing means and an output of said recorded waveform comparing means; and voltage dip detection output means for outputting a voltage dip detection output by logical addition (OR) between an output of said logical multiplication (AND) means and an output of said continuity determination means.

19. The instantaneous voltage dip detection device according to claim 18 further comprising: waveform integrating means for integrating a predetermined calculation value of the supply voltage waveform in synchronization with the phase lock means; integrated threshold generating means for generating, in synchronization with said phase lock means, a supply voltage integration threshold serving as a voltage dip determination reference with respect to a supply voltage integrated value; integrated value comparing means for outputting a voltage dip signal based on a comparison between said supply voltage waveform integrated value and the integrated threshold in the case that said determination region setting means has determined a comparative determination effective region of the waveform integrated value; logical addition (OR) means between an output of said supply voltage waveform comparing means and an output of said integrated value comparing means; and logical multiplication (AND) means between an output of said logical addition (OR) means and an output of said recorded waveform comparing means; wherein an input of said logical multiplication (AND) means is any of an output of said recorded waveform comparing means, an output of said supply voltage waveform comparing means, or an output of said integrated value comparing means.

* * * * *

UNITED STATES PATENT AND TRADEMARK OFFICE
CERTIFICATE OF CORRECTION

PATENT NO. : 7,034,515 B2
APPLICATION NO. : 10/516690
DATED : April 25, 2006
INVENTOR(S) : Yasufumi Shimoe and Yoshihiro Hatakeyama It is certified that error appears in the above-identified patent and that said Letters Patent is hereby corrected as shown below:

column 12, line 66, delete "being";
column 15, line 19, change "the normal" to --a--;
column 15, line 20, after "and" insert --a--;
column 15, line 22, delete "being a difference";
column 15, line 25, change "the zero" to --said zero--;
column 15, line 41, change "being" to --the supply waveform voltage is--;
column 15, line 42, change "being" to --it is--;
column 15, line 48, change "being" to --the phase shift voltage waveform is--;
column 15, line 50, change "being" to --it is--;
column 15, line 52, delete "on the negative side of the phase";
column 15, line 55, change "establishes also" to --also establishes--;
column 15, line 58, after "phase;" insert --and--;
column 15, line 65, change "being" to --the phase shift voltage waveform is--;
column 15, line 66, change "being" to --it is--;
column 16, line 4, change "being" to --the phase shift voltage waveform is--;
column 16, line 5, change "being" to --it is--;
column 16, line 22, change "being" to --the phase shift voltage waveform is--;
column 16, line 23, change "being" to --the phase shift voltage waveform is--;
column 16, line 29, change "being" to --it is--;
column 16, line 47, delete "a"

Signed and Sealed this

Twenty-ninth Day of August, 2006

JON W. DUDAS
*Director of the United States Patent and Trademark Office*